(12) United States Patent
Hsieh et al.

(10) Patent No.: US 11,172,287 B2
(45) Date of Patent: Nov. 9, 2021

(54) STRUCTURE OF MICRO-ELECTRO-MECHANICAL-SYSTEM MICROPHONE AND METHOD FOR FABRICATING THE SAME

(71) Applicant: Solid State System Co., Ltd., Hsinchu (TW)

(72) Inventors: Tsung-Min Hsieh, New Taipei (TW); Cheng-Wei Tsai, Taichung (TW); Chien-Hsing Lee, Hsinchu County (TW)

(73) Assignee: Solid State System Co., Ltd., Hsinchu (TW)

( * ) Notice: Subject to any disclaimer, the term of this patent is extended or adjusted under 35 U.S.C. 154(b) by 86 days.

(21) Appl. No.: 16/673,962

(22) Filed: Nov. 5, 2019

(65) Prior Publication Data

US 2021/0136483 A1    May 6, 2021

(51) Int. Cl.
   *H04R 1/24*    (2006.01)
   *H04R 3/00*    (2006.01)
   *B81B 3/00*    (2006.01)

(52) U.S. Cl.
   CPC .......... *H04R 1/245* (2013.01); *B81B 3/0064* (2013.01); *H04R 3/00* (2013.01); *B81B 2201/0257* (2013.01)

(58) Field of Classification Search
   CPC ........ H04R 1/245; H04R 3/00; B81B 3/0064; B81B 2201/0257
   See application file for complete search history.

(56) References Cited

U.S. PATENT DOCUMENTS

| 10,250,998 B2 * | 4/2019 | Hsieh | H04R 31/003 |
| 10,343,898 B1 * | 7/2019 | Chen | H04R 7/08 |
| 2020/0339411 A1 * | 10/2020 | Chen | H04R 7/18 |

FOREIGN PATENT DOCUMENTS

| CN | 103281661 | 2/2019 |
| CN | 105721997 | 4/2019 |
| CN | 110022519 | 7/2019 |
| TW | 201943287 | 11/2019 |

OTHER PUBLICATIONS

"Office Action of Taiwan Counterpart Application", dated May 28, 2021, p. 1-p. 7.

* cited by examiner

*Primary Examiner* — Brian Ensey
(74) *Attorney, Agent, or Firm* — JCIPRNET (57) ABSTRACT

A structure of micro-electro-mechanical-system microphone includes a substrate of semiconductor, having a first opening in the substrate. A dielectric layer is disposed on the substrate, the dielectric layer has a second opening, corresponding to the first opening. A diaphragm is located within the second opening, having an embedded part held by the dielectric layer and an exposed part exposed by the second opening. The exposed part has a junction peripheral region, a buffer peripheral region and a central region. The junction region has an elastic structure with slits, the buffer peripheral region includes a plurality of holes and is disposed between the junction peripheral region and the central region. A backplate is disposed on the dielectric layer above the second opening, wherein the backplate includes venting holes distributed at a region corresponding to the central part of the diaphragm.

18 Claims, 8 Drawing Sheets

STRUCTURE OF MICRO-ELECTRO-MECHANICAL-SYSTEM MICROPHONE AND METHOD FOR FABRICATING THE SAME

BACKGROUND

1. Field of the Invention

The invention is related to MEMS (Micro Electro Mechanical System) microphone package technology, and particularly related to the structure of MEMS microphone.

2. Description of Related Art

Microphone has been designed based on semiconductor fabrication technology, so as to greatly reduce the size. The MEMS microphone is a popular device used in electronic apparatus to sense acoustic signals, such as the communication voice.

The function of the MEMS microphone to sense the acoustic signal is based on a diaphragm, which is affected the air pressure from the acoustic signal with a frequency, so to vibrate corresponding to the frequency and amplitude of the acoustic signal. The acoustic signal is then converted into electric signal for subsequent application in peripheral electronic apparatus.

The performance of the diaphragm as an essential factor to determine the performance of the MEMS microphone. Damage to the electrode pads or even also the diaphragm should be at least avoided in fabrication.

How to design the MEMS structure with proper fabrication process to improve performance of the MEMS microphone is still under developing in the art.

SUMMARY OF THE INVENTION

The invention provides a structure of MEMS microphone and the method for fabricating the MEMS microphone. The cut-off frequency of the diaphragm may be kept low, and the damage to the electrode plate of the MEMS microphone in etching the dielectric material during fabrication may also be also reduced.

In an embodiment, the invention provides a structure of MEMS microphone includes a substrate of semiconductor, having a first opening in the substrate. A dielectric layer is disposed on the substrate, the dielectric layer has a second opening, corresponding to the first opening. A diaphragm, located within the second opening, having an embedded part held by the dielectric layer and an exposed part exposed by the second opening. The exposed part has a junction peripheral region, a buffer peripheral region and a central region. The junction region has an elastic structure with slits, the buffer peripheral region includes a plurality of holes and is disposed between the junction peripheral region and the central region. A backplate is disposed on the dielectric layer above the second opening, wherein the backplate includes venting holes distributed at a region corresponding to the central part of the diaphragm.

In an embodiment, the invention also provides a method for fabricating MEMS microphone. The method includes providing a preliminary structure. The preliminary structure includes a silicon substrate, having a first opening in the silicon substrate. A dielectric layer is disposed on the silicon substrate, having a portion exposed by the first opening, wherein a diaphragm is formed in the dielectric layer. The diaphragm is configured to have an embedded part surrounding the first opening and an exposed part within the embedded part corresponding to the first opening. The exposed part has a junction peripheral region, a buffer peripheral region and a central region. The junction region has an elastic structure with slits, the buffer peripheral region includes a plurality of holes and is disposed between the junction peripheral region and the central region. A backplate is disposed on the dielectric layer, wherein the backplate includes venting holes distributed at a region corresponding to the central part of the diaphragm. An isotropic etching process is performed to etch the dielectric layer through the first opening of the silicon substrate and the venting holes of the backplate, so as to form a second opening in the dielectric layer to expose the exposed part of the diaphragm and the backplate. The holes and the slits of the diaphragm allow an etchant to flow through to etch a dielectric material of the dielectric layer.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

The invention is directed to a structure of MEMS microphone and a method for fabricating the MEMS microphone.

The diaphragm of the MEMS microphone is formed with a plurality of holes at a buffer peripheral region between a junction peripheral region and a central region of the diaphragm. The holes may further reduce the low frequency decay in sensitivity of the diaphragm. In addition, the holes provide effective capability to release the diaphragm at the buffer peripheral region in etching the dielectric material. The damage to the backplate and/or the diaphragm may be also reduced.

Several embodiments are provided for describing the invention. However, the invention is not just limited to the embodiments as provided. Further, the embodiments therebetween may also allow a suitable combination.

The invention has looked into the fabrication of MEMS microphone and discovered the issues in the MEMS microphone to be solved.

Figure 1:
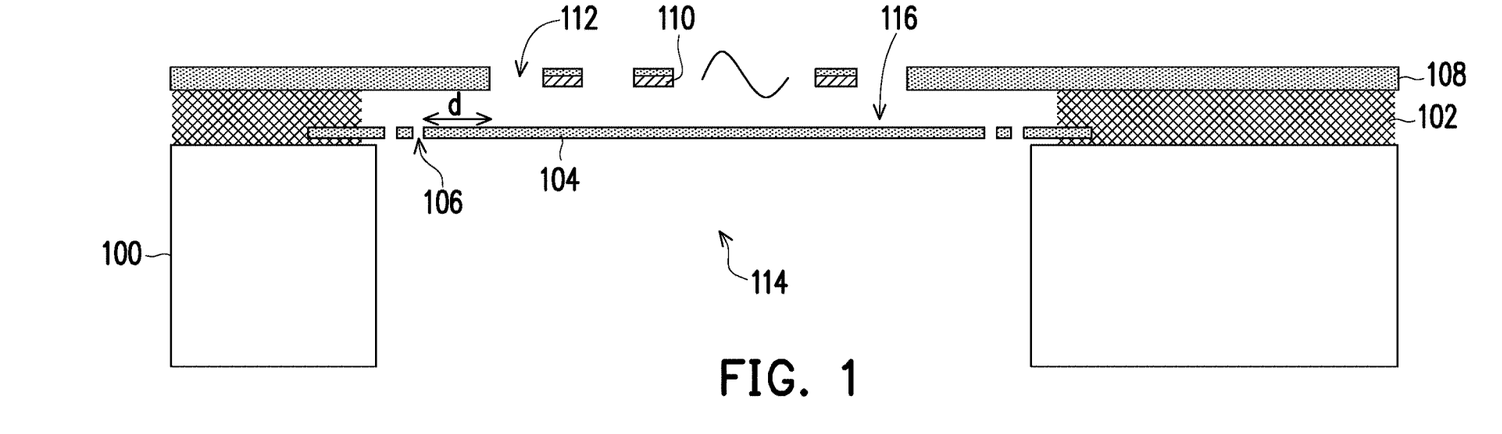
FIG. 1 is a drawing, schematically illustrating a cross-sectional view of a structure of MEMS microphone as looked into, according to an embodiment of the invention.

FIG. 1 is a drawing, schematically illustrating a cross-sectional view of a structure of MEMS microphone as looked into, according to an embodiment of the invention. Referring to FIG. 1, a MEMS microphone usually includes a silicon substrate 100 having an opening 114 at the predetermined region. A dielectric layer 102 is disposed on the silicon substrate 100. The dielectric layer 102 is also formed to have an opening 116 corresponding to the opening 114 in the silicon substrate 100. A diaphragm 104 is held by the dielectric layer 102 at the end part, which is embedded into the dielectric layer 102. To at least allow the diaphragm to easily vibrate without breaking, the junction region to the dielectric layer 102 may be formed with an elastic structure, such as spring structure. Due to the spring structure, the slits 106 are existing between the spring body. A backplate is the formed on the dielectric layer 102. The backplate in an embodiment may be formed by a passivation layer 108 with the electrode layer 110 on the passivation layer 108. The backplate has a plurality of venting holes 112, so as to pass the acoustic signal onto the diaphragm 104. The backplate structure in the invention is not limited to the embodiments. A capacitance between the diaphragm 104 and the electrode plate 110 may is changing with the frequency and amplitude of the acoustic signal. The capacitance may be detected to convert into electric signals.

The slits 106 are existing at the edge of the diaphragm 104 and have a gap d to the venting hole 112, the slits 106 may cause a low frequency decay in sensitivity as to be looked into later.

Figure 2:
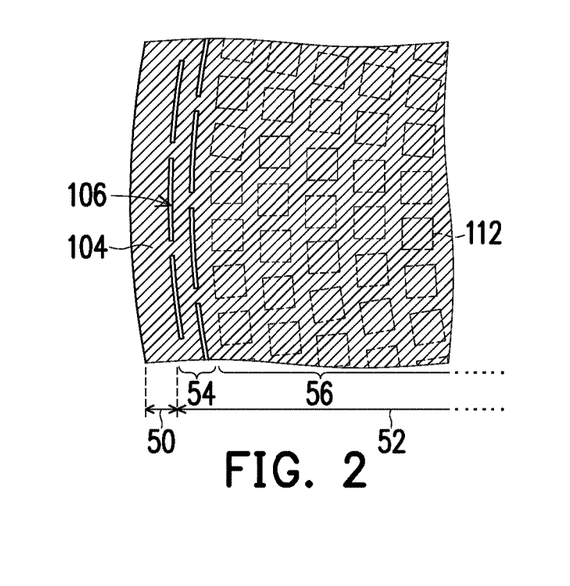
FIG. 2 is a drawing, schematically illustrating a plane view of a portion of diaphragm of the MEMS microphone in FIG. 1.

The invention has further looked into the factor to at least cause the low frequency decay in sensitivity. FIG. 2 is a drawing, schematically illustrating a plane view of a portion of diaphragm of the MEMS microphone in FIG. 1. Referring to FIG. 2, the diaphragm 104 usually is configured into the embedded part 50 which is embedded into the dielectric layer 102, so the diaphragm 104 may be firmly held with the opening 116 of the dielectric layer 102. The exposed part of the diaphragm 104 is the part exposed by the opening 116, which is joined to the opening 114. The slits 106 are located at the junction peripheral region 54 of the expose part 52 of the diaphragm. The diaphragm 104 at the exposed part 52 is corresponding to a region of the venting holes 112 in the backplate or the passivation layer 108 as shown by dotted line region.

Figure 3:
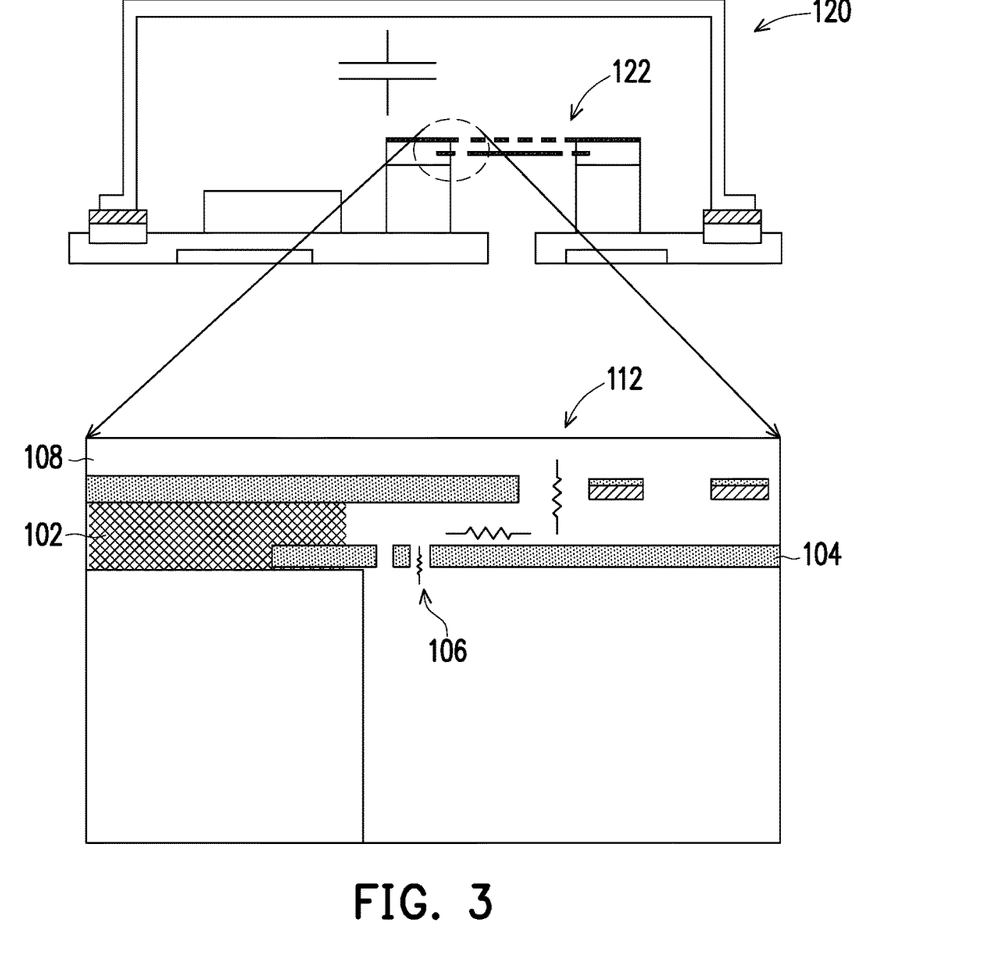
FIG. 3 is a drawing, schematically illustrating a sensing issue in a MEMS microphone as looked into, according to an embodiment of the invention.

FIG. 3 is a drawing, schematically illustrating a sensing issue in a MEMS microphone as looked into, according to an embodiment of the invention. Referring to FIG. 3, as to the practical application of the MEMS microphone in package structure, a MEMS microphone 122 and a ASIC die are disposed on a circuit board with a cap to cover over the ASIC die and the MEMS microphone 122. The structure at the junction peripheral region expanded at the lower drawing.

In this structure, the capacitance Cbv may exist under the cap. In addition, various parasitic acoustic resistances would be created by the slit 106 as RS, the gap d between the slit and the venting holes 112 as Rg, and the venting holes 112 as RV. A cut-off frequency of may be represent in Equation 1:

$$fo = \frac{1}{2 \cdot \pi \cdot Cbv \cdot Rvent} \quad (1)$$

where the acoustic resistance Rvent is as sum of Rs, Rg and Rv, by Rvent=Rs+Rg+Rv.

Figure 4:
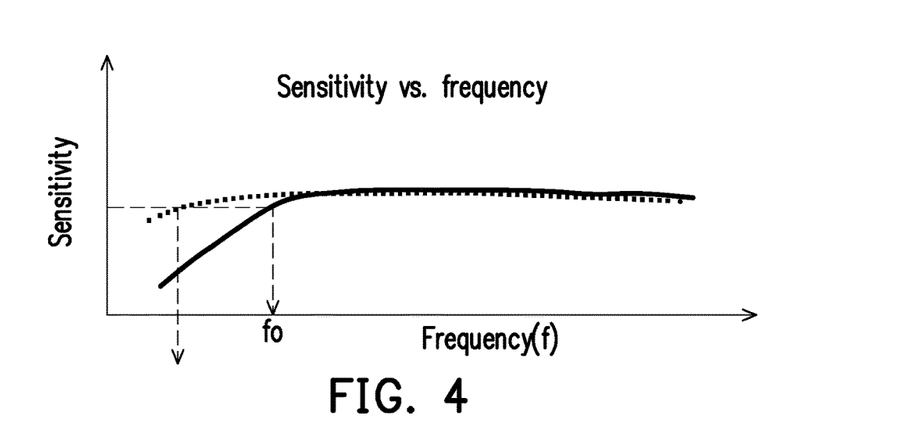
FIG. 4 is a drawing, schematically illustrating a sensitivity with respect to acoustic frequency as looked into, according to an embodiment of the invention.

FIG. 4 is a drawing, schematically illustrating a sensitivity with respect to acoustic frequency as looked into, according to an embodiment of the invention. Referring to FIG. 4, the cut-off frequency fo is depending on the acoustic resistance Rvent. The solid line shows the sensitivity in response to the acoustic frequency (f) with a small value of the acoustic resistance Rvent while the dotted line is with respect to a larger acoustic resistance Rvent.

As looking into the acoustic resistance Rvent, the resistances of Rs and Rv may be set without effectively changed in fabrication. The acoustic resistance Rg may be the factor to be effectively adjusted so as to significantly increase the acoustic resistance Rvent and then reduce the cut-off frequency fo.

As looking into the structure in FIG. 1, although the gap d may be designed to have sufficient gap to increase the acoustic resistance Rvent, the dielectric material of the dielectric layer 102 is not easily etched during fabrication.

In general consideration, the slits 106 are used to release the residual stress in diaphragm and adjust the stiffness of diaphragm. The slits 106 are also used as an additional ventilation holes for the balance of air pressure. However, the slits 106 in diaphragm creates a low frequency decay. To reduce the low frequency decay, the gap d between vent hole 112 and slits 106 has to be long enough to create a high acoustic resistance. However, the long gap d would cause that a longer MEMS release time for releasing the diaphragm from the dielectric layer 102. If the MEMS release time is too long, the passivation layer 108 or electrode plate 110, such as the metal pads, may be damaged by the etchant.

In an embodiment of the invention, the MEMS microphone may have sufficient gap d between the slit and the venting holes and the dielectric material may also be etched in fast rate to avoid the damages at leas to the electrode plate.

Figure 5:
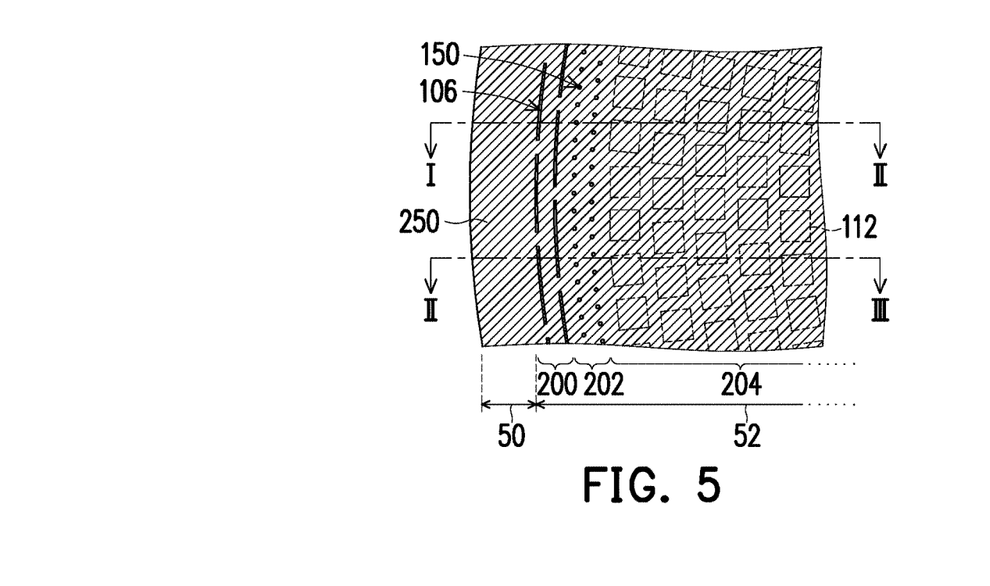
FIG. 5 is a drawing, schematically illustrating a plane view of a portion of diaphragm of the MEMS microphone, according to an embodiment of the invention.

FIG. 5 is a drawing, schematically illustrating a plane view of a portion of diaphragm of the MEMS microphone, according to an embodiment of the invention. Referring to FIG. 5, and also a similar part in FIG. 1, the diaphragm 104 in FIG. 1 is modified into the diaphragm 250, in an embodiment. The diaphragm 250 may also has the embedded part 50, which is predetermined to be embedded in the dielectric layer 102 for holding the diaphragm 250. The exposed part 52 of the diaphragm 250 is exposed in the opening 116 of the dielectric layer 102. The exposed part 52 of the diaphragm 250, in an embodiment, has a junction peripheral region 200, a buffer peripheral region 202 and a central region 204. The junction region 200 has an elastic structure with slits 106, the buffer peripheral region 202 includes a plurality of holes 150 and is disposed between the junction peripheral region 200 and the central region 204. The venting holes 112 of passivation layer 108 of the backplate is indicated by dotted line region over the diaphragm 250.

Generally, the gap d between venting holes 112 and slits 106 is long enough to increase the acoustic resistance. Further, to keep the fast release time of the diaphragm 250 from the dielectric layer 102, the small holes 150 in the buffer peripheral region 202 are formed between the slits 106 and the venting holes 112. During etching process on the dielectric material, the etchant can pass the holes 150 to etch the dielectric material between the passivation layer 108 of the backplate and the diaphragm 250. In addition, the holes 150 may be composed by small holes, so that the acoustic resistance Rvent may even be kept high as well.

Figure 6:
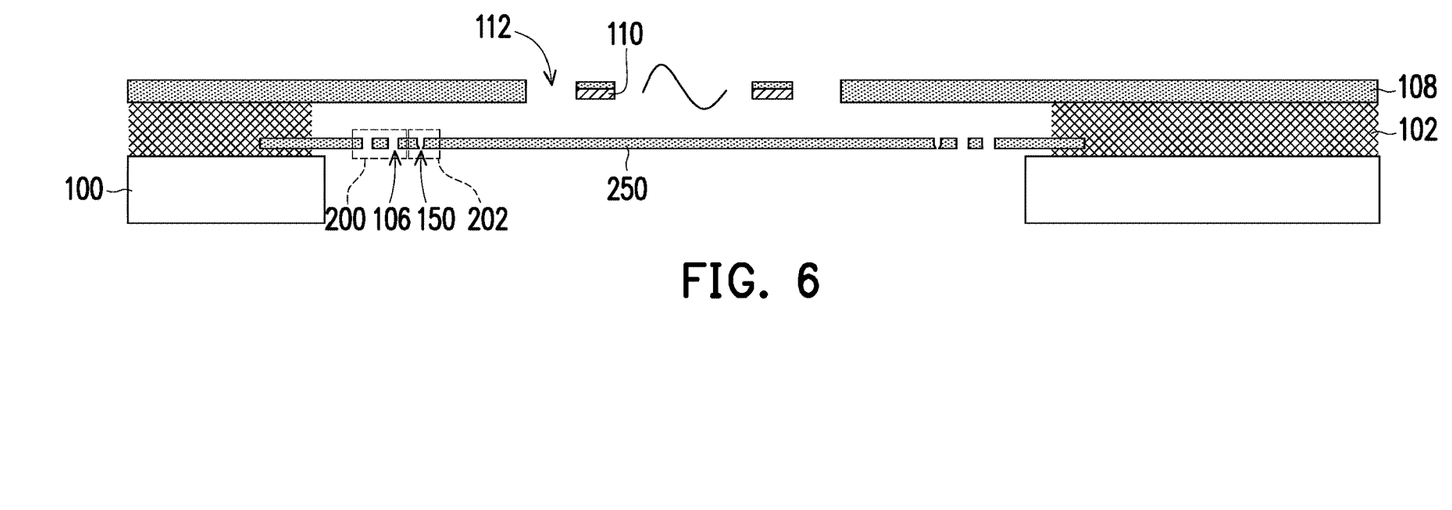
FIG. 6 is a drawing, schematically illustrating a cross-sectional view of the MEMS microphone, cutting on line I-I in FIG. 5, according to an embodiment of the invention.

FIG. 6 is a drawing, schematically illustrating a cross-sectional view of the MEMS microphone, cutting on line I-I in FIG. 5, according to an embodiment of the invention. Referring to FIG. 6, the cross-sectional view is cutting at the line II-II, which crosses the holes 150 and the venting holes 112. The buffer peripheral region 202 abuts to the junction peripheral region 200 at inner side. The slits 106 are distributed in the junction peripheral region 200 and a plurality of holes 150 in small size are distributed in the buffer peripheral region 202, surrounding the central region 204 in FIG. 5. In other hand, the plane view in FIG. 5 is the cross-sectional view on the plane of the diaphragm 250. The width of the slits 106 is larger than the width of the hole 150.

Figure 7:
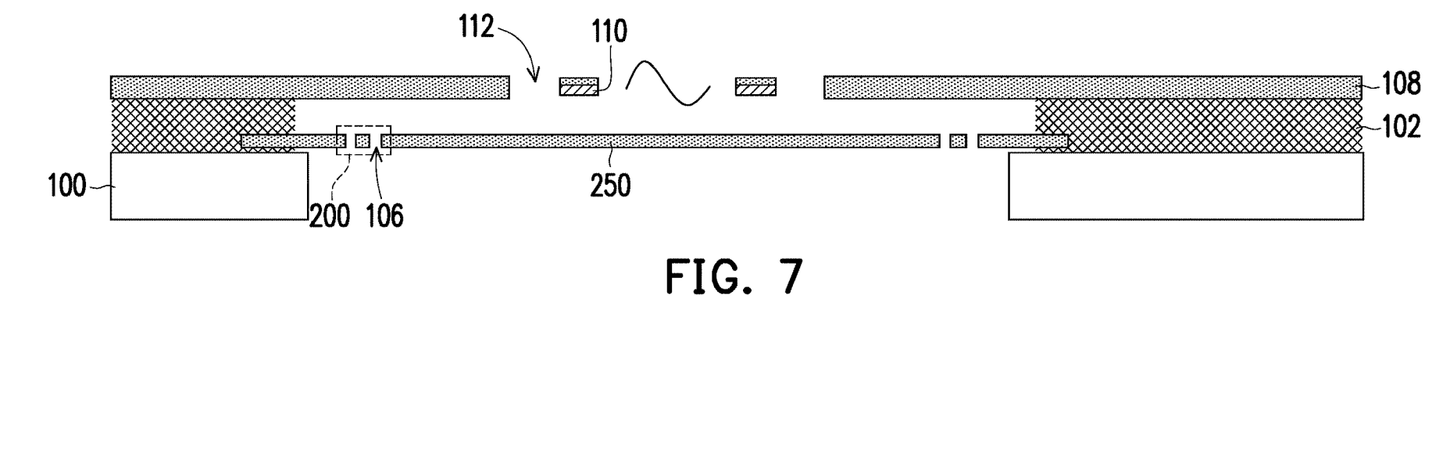
FIG. 7 is a drawing, schematically illustrating a cross-sectional view of the MEMS microphone, cutting on line II-II in FIG. 5, according to an embodiment of the invention.

FIG. 7 is a drawing, schematically illustrating a cross-sectional view of the MEMS microphone, cutting on line II-II in FIG. 5, according to an embodiment of the invention. Referring to FIG. 7, the cross-sectional view is cutting at the line III-III, which does not cross the holes 150 and the venting holes 112. In this structure, only the slits 106 are seen. However, the patterns of the slits 106 and the holes 150 in the embodiment do not limit the invention. In an embodiment, the slits 106 may evenly distributed. Likewise, the holes 150 may also evenly distributed in rings surrounding the central region 204 in FIG. 5. The density of the holes 150 in an embodiment may also be adjusted to have a faster rate to etch the dielectric layer 102 as to be also described in batter detail.

Figure 8:
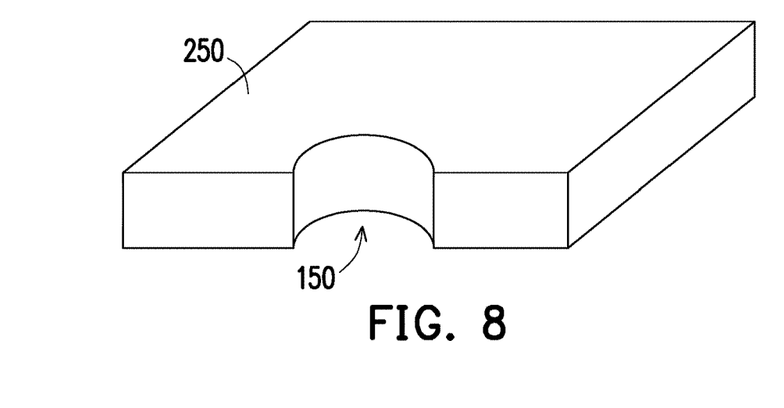
FIG. 8 is a drawing, schematically illustrating a perspective and cross-sectional view of a portion of the diaphragm with the holes, according to an embodiment of the invention.

FIG. 8 is a drawing, schematically illustrating a perspective and cross-sectional view of a portion of the diaphragm with the holes, according to an embodiment of the invention. Referring to FIG. 8, the size of the holes 150 may keep being small so to maintain the high acoustic resistance. The width of the holes 150 in an embodiment may be in a range between 1 micron to 3 microns. In an embodiment, the shape of the holes 150 may be a round hole then the width is the diameter by two times of radius, 2r. The acoustic resistance for the hole is proportional to $h/r^4$, h is the thickness of the diaphragm 250, that is, the diaphragm 104 in other hand.

Figure 9:
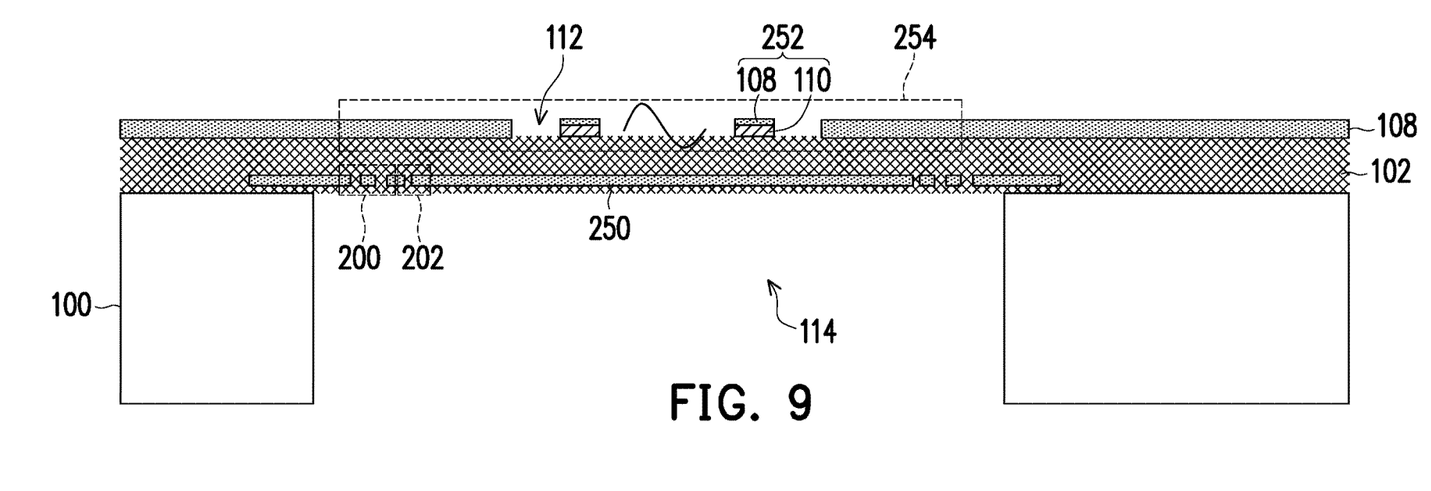
FIG. 9 is a drawing, schematically illustrating a cross-sectional view of the MEMS microphone in a fabricating process flow, according to an embodiment of the invention.

FIG. 9 is a drawing, schematically illustrating a cross-sectional view of the MEMS microphone in a fabricating process flow, according to an embodiment of the invention. Referring to FIG. 9 and also partially referring to the previous drawings for the same reference numbers of the elements, in the aspect of fabricating method, a preliminary structure may be formed. The preliminary structure includes a substrate 100 of silicon, having an opening 114 in the substrate 100. A dielectric layer 102 is disposed on the substrate 100, having a portion exposed by the opening 114, wherein a diaphragm 250 is formed in the dielectric layer 102. The diaphragm 250 is configured to have an embedded part 50 surrounding the opening 114 and an exposed part 52 within the embedded part 50 corresponding to the opening 114. The exposed part 52 has a junction peripheral region 200, a buffer peripheral region 202 and a central region 204.

The junction region 200 has an elastic structure with slits 106, the buffer peripheral region includes a plurality of holes 150 and is disposed between the junction peripheral region 200 and the central region 204. A backplate 252 with the passivation layer 108 and the electrode plate 110 is disposed on the dielectric layer 102, wherein the backplate 252 has venting holes 112 distributed at a region 254 corresponding to the central part 204 of the diaphragm 250.

As noted, the diaphragm 250 in the preliminary structure is fully embedded in the dielectric layer 102.

Figure 10:
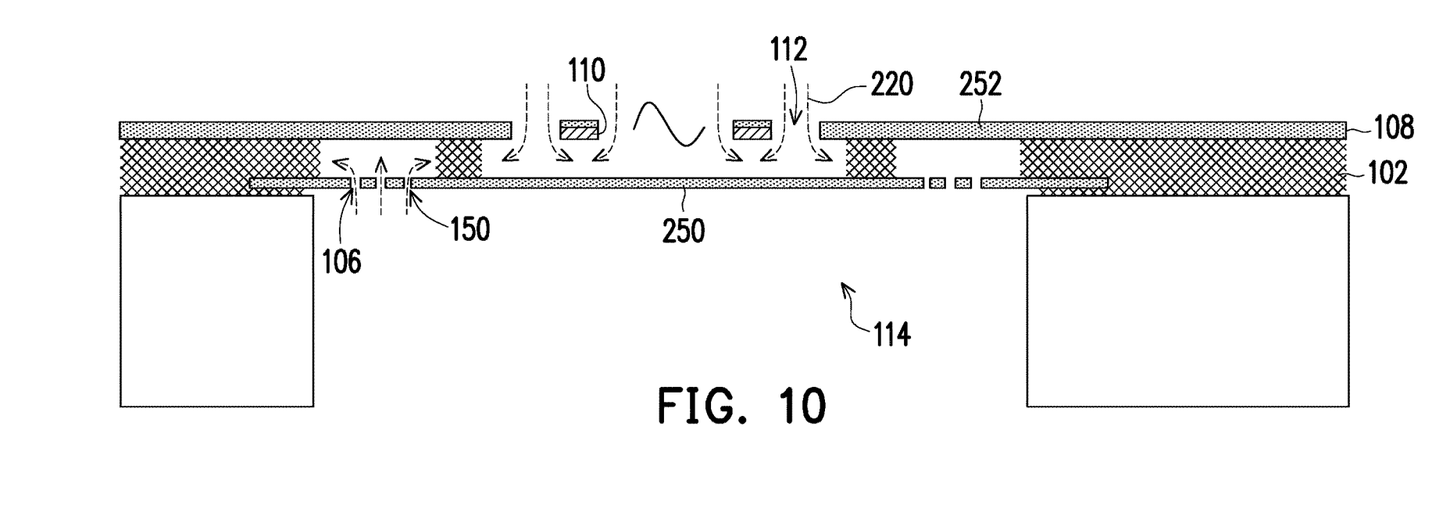
FIG. 10 is a drawing, schematically illustrating a cross-sectional view of the MEMS microphone in a fabricating process flow, according to an embodiment of the invention.

FIG. 10 is a drawing, schematically illustrating a cross-sectional view of the MEMS microphone in a fabricating process flow, according to an embodiment of the invention. Referring to FIG. 10, an isotropic etching process 220 is performed to etch the dielectric layer 102 through the opening 114 of the substrate and the venting holes of the backplate, so as to form an opening 116 in the dielectric layer 102 to expose the exposed part of the diaphragm 250 and the backplate 252. The holes 150 and the slits 106 of the diaphragm 250 allow etchant to flow through to etch a dielectric material of the dielectric layer 102.

As noted, the holes 150 indeed provides the additional etching capability on the dielectric layer 102 at the portion between the slit 106 and the venting holes 112. The time to release the diaphragm 250 is effectively reduced due to the holes 150.

Figure 11:
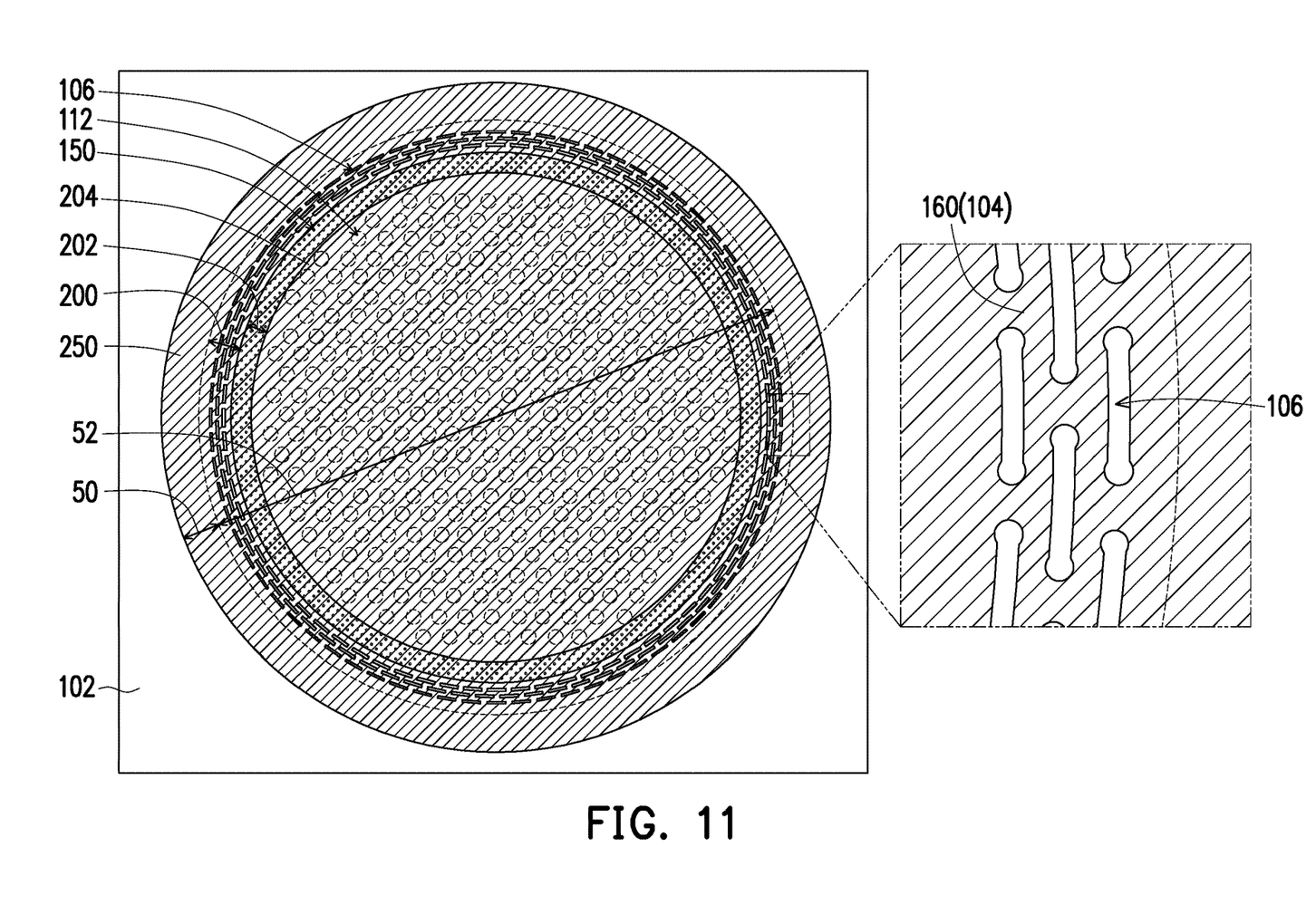
FIG. 11 is a drawing, schematically illustrating a top view over a MEMS microphone, according to an embodiment of the invention.

FIG. 11 is a drawing, schematically illustrating a top view over a MEMS microphone, according to an embodiment of the invention. Referring to FIG. 11, as perspective viewed from top on the MEMS microphone, the diaphragm 250 is a disk in an embodiment. As noted, only a portion of backplate with the venting hole 112 is shown in FIG. 11. However, the spring structure 160 as the elastic structure with the slits 106 are shown in expansion detail. The spring structure 160 can be formed in various manners. In the embodiment, the slits 106 are formed simply as straight pieces, extending as a regular circle ring. However, the geometric shape of the spring 160 is not limited to the embodiments.

Figure 12:
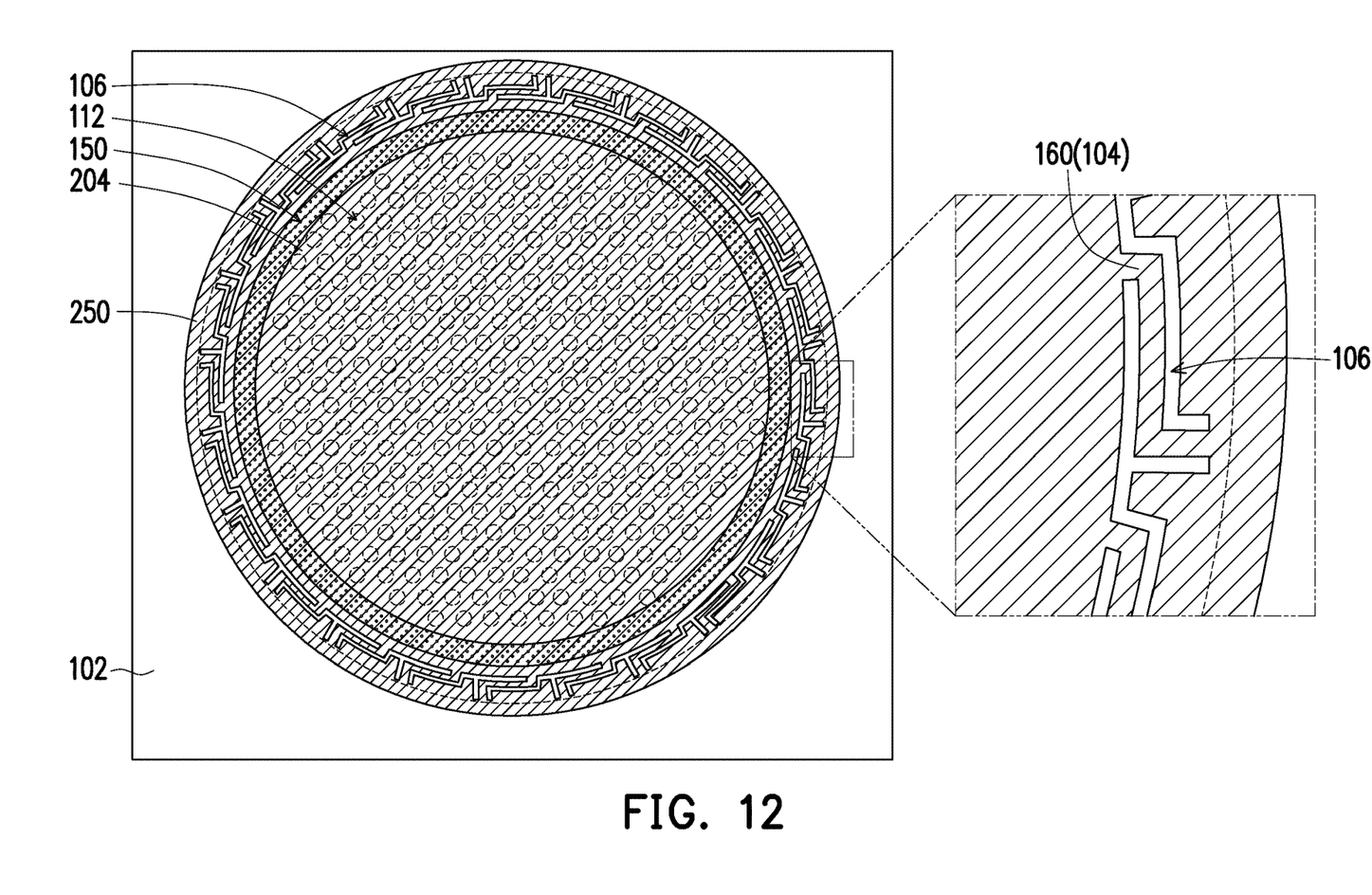
FIG. 12 is a drawing, schematically illustrating a top view over a MEMS microphone, according to an embodiment of the invention.

FIG. 12 is a drawing, schematically illustrating a top view over a MEMS microphone, according to an embodiment of the invention. Referring to FIG. 12, as to the spring structure 160, slits 106 may be a bent shape depending on the bending manner of the spring structure 160.

Figure 13:
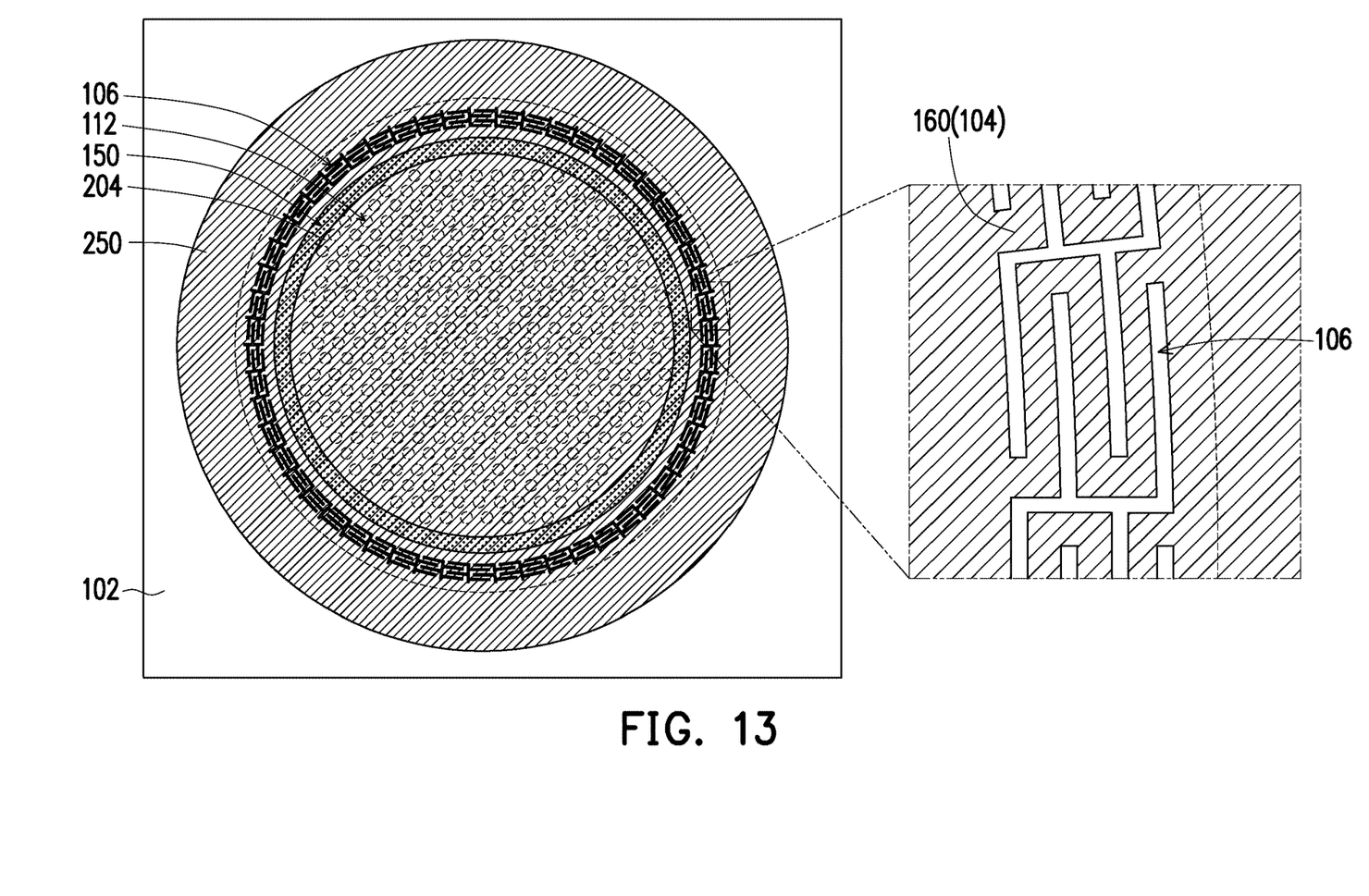
FIG. 13 is a drawing, schematically illustrating a top view over a MEMS microphone, according to an embodiment of the invention.

FIG. 13 is a drawing, schematically illustrating a top view over a MEMS microphone, according to an embodiment of the invention. Referring to FIG. 13, in a further embodiment for the spring structure 160, the spring structure may be a meander structure, so the slits 106 has the branches.

As noted, the slits 106 is depending on the spring structure 160 as actually designed. The spring structure in the invention is not just limited to the embodiments.

As the foregoing description, in an embodiment, the invention provides a structure of MEMS microphone includes a substrate of semiconductor, having a first opening in the substrate. A dielectric layer is disposed on the substrate, the dielectric layer has a second opening, corresponding to the first opening. A diaphragm, located within the second opening, having an embedded part held by the dielectric layer and an exposed part exposed by the second opening. The exposed part has a junction peripheral region, a buffer peripheral region and a central region. The junction region has an elastic structure with slits, the buffer peripheral region includes a plurality of holes and is disposed between the junction peripheral region and the central region. A backplate is disposed on the dielectric layer above the second opening, wherein the backplate includes venting holes distributed at a region corresponding to the central part of the diaphragm.

In an embodiment, as to the structure of MEMS microphone, the backplate comprises a passivation layer disposed on the dielectric layer and an electrode plate disposed on the passivation layer.

In an embodiment, as to the structure of MEMS microphone, the electrode plate on the one side of the passivation layer facing the diaphragm.

In an embodiment, as to the structure of MEMS microphone, the junction region of the diaphragm includes a spring structure, wherein the slits are formed between spring bars.

In an embodiment, as to the structure of MEMS microphone, the holes of the diaphragm at the buffer region are uniformly distributed in the buffer region.

In an embodiment, as to the structure of MEMS microphone, a width of the holes is smaller than a width of the slits.

In an embodiment, as to the structure of MEMS microphone, the width of the holes is between 1 and 3 microns.

In an embodiment, as to the structure of MEMS microphone, the buffer peripheral region of the diaphragm provides a space gap between slits and the venting hole to reduce a low frequency decay from the slits.

In an embodiment, as to the structure of MEMS microphone, the holes in the buffer peripheral region allows a dielectric etchant to flow through.

In an embodiment, as to the structure of MEMS microphone, the venting holes of the backplate are distributed into a plurality of ring surrounding a center point of the diaphragm.

In an embodiment, the invention also provides a method for fabricating MEMS microphone. The method includes providing a preliminary structure. The preliminary structure includes a silicon substrate, having a first opening in the silicon substrate. A dielectric layer is disposed on the silicon substrate, having a portion exposed by the first opening, wherein a diaphragm is formed in the dielectric layer. The diaphragm is configured to have an embedded part surrounding the first opening and an exposed part within the embedded part corresponding to the first opening. The exposed part has a junction peripheral region, a buffer peripheral region and a central region. The junction region has an elastic structure with slits, the buffer peripheral region includes a plurality of holes and is disposed between the junction peripheral region and the central region. A backplate is disposed on the dielectric layer, wherein the backplate includes venting holes distributed at a region corresponding to the central part of the diaphragm. An isotropic etching process is performed to etch the dielectric layer through the first opening of the silicon substrate and the venting holes of the backplate, so as to form a second opening in the dielectric layer to expose the exposed part of the diaphragm and the backplate. The holes and the slits of the diaphragm allow an etchant to flow through to etch a dielectric material of the dielectric layer.

In an embodiment, as to the method for fabricating MEMS microphone, the backplate comprises: a passivation layer disposed on the dielectric layer; and an electrode plate disposed on the passivation layer.

In an embodiment, as to the method for fabricating MEMS microphone, the electrode plate on the one side of the passivation layer facing the diaphragm.

In an embodiment, as to the method for fabricating MEMS microphone, the junction region of the diaphragm includes a spring structure, wherein the slits are formed between spring bars.

In an embodiment, as to the method for fabricating MEMS microphone, the holes of the diaphragm at the buffer region are uniformly distributed in the buffer region.

In an embodiment, as to the method for fabricating MEMS microphone, a width of the holes is smaller than a width of the slits.

In an embodiment, as to the method for fabricating MEMS microphone, the width of the holes is between 1 and 3 microns.

In an embodiment, as to the method for fabricating MEMS microphone, the buffer peripheral region of the diaphragm provides a space gap between slits and the venting hole to reduce a low frequency decay from the slits.

In an embodiment, as to the method for fabricating MEMS microphone, the holes in the buffer peripheral region adding an etching capability to the dielectric material disposed at the buffer peripheral region.

In an embodiment, as to the method for fabricating MEMS microphone, the venting holes of the backplate are distributed into a plurality of ring surrounding a center point of the diaphragm.

In the embodiments, the diaphragm is provided to form a plurality of hole at the buffer peripheral region. The time to release the diaphragm is effectively reduced. The small holes at the buffer peripheral region may also cause the high acoustic resistance, so to reduce the low frequency decay in sensitivity.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A structure of micro-electro-mechanical-system (MEMS) microphone, comprising:
    a substrate of semiconductor, having a first opening in the substrate;
    a dielectric layer, disposed on the substrate, wherein the dielectric layer has a second opening corresponding to the first opening;
    a diaphragm, located within the second opening, having an embedded part held by the dielectric layer and an exposed part exposed by the second opening, wherein the exposed part has a junction peripheral region, a buffer peripheral region and a central region, wherein the junction region has an elastic structure with slits, the buffer peripheral region includes a plurality of holes and is disposed between the junction peripheral region and the central region;
    a backplate, disposed on the dielectric layer above the second opening, wherein the backplate includes venting holes distributed at a region corresponding to the central part of the diaphragm,
    wherein the buffer peripheral region of the diaphragm provides a space gap between slits and the venting hole to reduce a low frequency decay from the slits.

2. The structure of MEMS microphone of claim 1, wherein the backplate comprises:
    a passivation layer disposed on the dielectric layer; and
    an electrode plate, disposed on the passivation layer.

3. The structure of MEMS microphone of claim 2, wherein the electrode plate on the one side of the passivation layer facing the diaphragm.

4. The structure of MEMS microphone of claim 1, wherein the junction region of the diaphragm includes a spring structure, wherein the slits are formed between spring bars.

5. The structure of MEMS microphone of claim 1, wherein the holes of the diaphragm at the buffer region are uniformly distributed in the buffer region.

6. The structure of MEMS microphone of claim 1, wherein a width of the holes is smaller than a width of the slits.

7. The structure of MEMS microphone of claim 1, wherein the width of the holes is between 1 and 3 microns.

8. The structure of MEMS microphone of claim 1, wherein the holes in the buffer peripheral region allows a dielectric etchant to flow through.

9. The structure of MEMS microphone of claim 1, wherein the venting holes of the backplate are distributed into a plurality of ring surrounding a center point of the diaphragm.

10. A method for fabricating micro-electro-mechanical-system (MEMS) microphone, comprising:
providing a preliminary structure, including:
a silicon substrate of semiconductor, having a first opening in the silicon substrate;
a dielectric layer disposed on the silicon substrate, having a portion exposed by the first opening, wherein a diaphragm is formed in the dielectric layer, wherein the diaphragm is configured to have an embedded part surrounding the first opening and an exposed part within the embedded part corresponding to the first opening, wherein the exposed part has a junction peripheral region, a buffer peripheral region and a central region, wherein the junction region has an elastic structure with slits, the buffer peripheral region includes a plurality of holes and is disposed between the junction peripheral region and the central region;
a backplate disposed on the dielectric layer, wherein the backplate includes venting holes distributed at a region corresponding to the central part of the diaphragm; and
performing an isotropic etching process to etch the dielectric layer through the first opening of the silicon substrate and the venting holes of the backplate, so as to form a second opening in the dielectric layer to expose the exposed part of the diaphragm and the backplate,
wherein the holes and the slits of the diaphragm allow an etchant to flow through to etch a dielectric material of the dielectric layer,
wherein the buffer peripheral region of the diaphragm provides a space gap between slits and the venting hole to reduce a low frequency decay from the slits.

11. The method for fabricating MEMS microphone of claim 10, wherein the backplate comprises:
a passivation layer disposed on the dielectric layer; and
an electrode plate, disposed on the passivation layer.

12. The method for fabricating MEMS microphone of claim 11, wherein the electrode plate on the one side of the passivation layer facing the diaphragm.

13. The method for fabricating MEMS microphone of claim 10, wherein the junction region of the diaphragm includes a spring structure, wherein the slits are formed between spring bars.

14. The method for fabricating MEMS microphone of claim 10, wherein the holes of the diaphragm at the buffer region are uniformly distributed in the buffer region.

15. The method for fabricating MEMS microphone of claim 10, wherein a width of the holes is smaller than a width of the slits.

16. The method for fabricating MEMS microphone of claim 10, wherein the width of the holes is between 1 and 3 microns.

17. The method for fabricating MEMS microphone of claim 10, wherein the holes in the buffer peripheral region adding an etching capability to the dielectric material disposed at the buffer peripheral region.

18. The structure of MEMS microphone of claim 10, wherein the venting holes of the backplate are distributed into a plurality of ring surrounding a center point of the diaphragm.

* * * * *